(12) United States Patent
Beals et al.

(10) Patent No.: US 12,735,365 B2
(45) Date of Patent: Sep. 15, 2026

(54) ENVIRONMENTAL BARRIER COATING AND METHOD OF APPLYING THE SAME

(71) Applicant: RAYTHEON TECHNOLOGIES CORPORATION, Farmington, CT (US)

(72) Inventors: James T. Beals, West Hartford, CT (US); Xia Tang, West Hartford, CT (US); Richard Wesley Jackson, III, Mystic, CT (US); Andrew Spaeth, Holden, MA (US)

(73) Assignee: RTX CORPORATION, Farmington, CT (US)

( * ) Notice: Subject to any disclaimer, the term of this patent is extended or adjusted under 35 U.S.C. 154(b) by 208 days.

(21) Appl. No.: 18/134,970

(22) Filed: Apr. 14, 2023

(65) Prior Publication Data

US 2024/0343917 A1 Oct. 17, 2024

(51) Int. Cl.
*C04B 41/52* (2006.01)
*C04B 41/87* (2006.01)
(Continued)

(52) U.S. Cl.
CPC .............. *C04B 41/52* (2013.01); *C04B 41/87* (2013.01); *C04B 41/89* (2013.01); *C09D 1/00* (2013.01);
(Continued)

(58) Field of Classification Search
CPC ............ C04B 41/52–526; C23C 28/30; C23C 28/32–3215; C23C 28/3455; F01D 5/288; F05D 2230/611; F05D 2230/6111; F05D 2230/90; Y10T 428/24479; Y10T 428/24521; Y10T 428/24529; Y10T 428/24537; Y10T 428/24545; Y10T 428/2457; Y10T 428/24587; Y10T 428/24595; Y10T 428/24612; Y10T 428/2462; Y10T 428/24628; Y10T 428/24669
See application file for complete search history.

(56) References Cited

U.S. PATENT DOCUMENTS 10,604,454 B1 3/2020 Zhu et al.
11,325,869 B1 5/2022 Lee et al.
(Continued)

FOREIGN PATENT DOCUMENTS

CN 114988895 9/2022
EP 3754049 A1 12/2020
(Continued)

OTHER PUBLICATIONS

Evidence of publication of GB 202207827D0.*
European Search Report for EP Application No. 24169974.3 dated Sep. 9, 2024.

*Primary Examiner* — Z. Jim Yang
(74) *Attorney, Agent, or Firm* — Carlson, Gaskey & Olds, P.C.

(57) ABSTRACT

An article includes a substrate, a barrier layer disposed on the substrate, and an oxide-based ceramic material topcoat disposed on the barrier layer. The topcoat includes at least one crack. The article also includes a filler layer disposed on the topcoat and in the at least one crack. A method of applying a coating to an article and an article are also disclosed.

20 Claims, 1 Drawing Sheet

(51) Int. Cl.

| | |
|---|---|
| ***C04B 41/89*** | (2006.01) |
| ***C09D 1/00*** | (2006.01) |
| ***C09D 5/00*** | (2006.01) |
| ***C09D 5/08*** | (2006.01) |
| ***C09D 5/18*** | (2006.01) |
| ***F01D 5/28*** | (2006.01) |
| *C23C 16/40* | (2006.01) |
| *C23C 16/455* | (2006.01) |

(52) U.S. Cl.

CPC ............... *C09D 5/002* (2013.01); *C09D 5/08* (2013.01); *C09D 5/18* (2013.01); *F01D 5/288* (2013.01); *C23C 16/401* (2013.01); *C23C 16/403* (2013.01); *C23C 16/405* (2013.01); *C23C 16/45529* (2013.01); *Y10T 428/24521* (2015.01); *Y10T 428/249957* (2015.04); *Y10T 428/24999* (2015.04)

(56) References Cited

U.S. PATENT DOCUMENTS

2004/0001977 A1* 1/2004 Subramanian .......... C23C 28/04 428/701
2005/0013994 A1* 1/2005 Strangman .......... C23C 18/1295 427/446
2007/0119713 A1* 5/2007 Hasz ........................ C25D 7/10 204/490
2009/0017260 A1* 1/2009 Kulkarni ............. C23C 28/3455 428/161
2012/0276352 A1* 11/2012 Liu ......................... F01D 5/288 428/312.8
2013/0004309 A1* 1/2013 Sambasivan ........ C04B 38/0096 428/221
2013/0196141 A1* 8/2013 Vassen .................. C23C 16/045 427/255.12
2014/0083115 A1* 3/2014 Von Nieda ........... G02B 5/0816 359/359
2015/0014179 A1* 1/2015 Doebber ............. C23C 18/1208 205/333
2015/0147524 A1* 5/2015 Petorak ................. C23C 28/042 428/141
2015/0197456 A1* 7/2015 Oboodi ................. C04B 41/009 427/446
2016/0369637 A1* 12/2016 Subramanian .......... F01D 5/288
2018/0119270 A1* 5/2018 Hoel ......................... C23C 4/18
2018/0163062 A1* 6/2018 Hoel ................. C04B 35/62222
2019/0032189 A1* 1/2019 Chen ....................... C23C 4/134
2019/0211696 A1* 7/2019 Keshavan ............. F01D 25/007
2019/0233929 A1* 8/2019 Torigoe ................... C23C 4/134
2019/0284104 A1* 9/2019 Tanigawa ............ C04B 41/0081
2020/0102843 A1* 4/2020 Bianchi ................... C23C 4/129
2020/0173033 A1* 6/2020 Keshavan ............... F01D 5/288
2020/0331817 A1* 10/2020 Bianchi ............... C04B 41/5096
2021/0131305 A1* 5/2021 Keshavan ........... C23C 28/3215
2021/0246080 A1 8/2021 Jackson et al.
2021/0276925 A1* 9/2021 Shi ........................ C04B 41/009
2022/0388917 A1* 12/2022 Jadidian .............. C04B 41/4558
2023/0382816 A1* 11/2023 Ushmaev ................ C04B 41/86
2024/0165661 A1* 5/2024 Mehr ................... B05D 3/0254

FOREIGN PATENT DOCUMENTS

EP 3954806 A1 * 2/2022 ............. C04B 35/14
WO 2022103665 5/2022

* cited by examiner

ENVIRONMENTAL BARRIER COATING AND METHOD OF APPLYING THE SAME

BACKGROUND

A gas turbine engine typically includes a fan section, a compressor section, a combustor section and a turbine section. Air entering the compressor section is compressed and delivered into the combustion section where it is mixed with fuel and ignited to generate a high-energy exhaust gas flow. The high-energy exhaust gas flow expands through the turbine section to drive the compressor and the fan section. The compressor section typically includes low and high pressure compressors, and the turbine section includes low and high pressure turbines.

This disclosure relates to composite articles, such as those used in gas turbine engines. Components, such as gas turbine engine components, may be subjected to high temperatures, corrosive and oxidative conditions, and elevated stress levels. In order to improve the thermal and/or oxidative stability, the component may include a protective barrier coating.

SUMMARY

An article according to an exemplary embodiment of this disclosure, among other possible things includes a substrate, a barrier layer disposed on the substrate, and an oxide-based ceramic material topcoat disposed on the barrier layer. The topcoat includes at least one crack. The article also includes a filler layer disposed on the topcoat and in the at least one crack.

In a further example of the foregoing, the barrier layer is a composite material. The composite material includes a matrix, diffusive particles dispersed in the matrix, and gettering particles dispersed in the matrix.

In a further example of any of the foregoing, the barrier layer is a monolithic layer.

In a further example of any of the foregoing, the topcoat includes at least one of a hafnium-based oxide, a ytterbium-based oxide, and a yttrium-based oxide.

In a further example of any of the foregoing, the filler layer has a coefficient of thermal expansion less than about $6\times10^{-6}\ K^{-1}$.

In a further example of any of the foregoing, a density of the filler layer is higher than a density of the topcoat.

In a further example of any of the foregoing, the filler layer includes at least one of HfO2, HfSiO4, ZrSiO4, Yb2Si2O7, a silicate glass, Al2O3, and combinations thereof.

In a further example of any of the foregoing, the filler layer has a thickness of between about 1 and about 2 microns.

In a further example of any of the foregoing, the crack has an aspect ratio of at least about 1:100.

A method of applying a coating to an article according to an exemplary embodiment of this disclosure, among other possible things includes disposing a barrier layer on a substrate and disposing a topcoat on the barrier layer. The topcoat includes at least one crack. The method also includes disposing a filler layer on the topcoat and in the at least one crack.

In a further example of the foregoing, the barrier layer is a composite material. The composite material includes a matrix, diffusive particles dispersed in the matrix, and gettering particles dispersed in the matrix.

In a further example of any of the foregoing, the barrier layer is a monolithic layer.

In a further example of any of the foregoing, the filler layer is disposed on the topcoat by atomic layer deposition.

In a further example of any of the foregoing, the atomic layer deposition is of a single layer.

In a further example of any of the foregoing, the atomic layer deposition is by alternating layers of first and second materials. The first and second materials react to form a third material.

In a further example of any of the foregoing, the filler layer is disposed on the topcoat by slurry coating.

In a further example of any of the foregoing, a driving force is applied to the topcoat during the slurry coating.

In a further example of any of the foregoing, the filler layer is disposed on the topcoat by chemical vapor deposition.

In a further example of any of the foregoing, the density of the filler is greater than a density of the topcoat.

In a further example of any of the foregoing, the filler layer includes at least one of HfO2, HfSiO4, ZrSiO4, Yb2Si2O7, a silicate glass, Al2O3, and combinations thereof.

An article according to an exemplary embodiment of this disclosure, among other possible things includes a substrate and an oxide-based ceramic material topcoat disposed on the substrate. The topcoat including at least one crack. The article also includes a filler layer disposed on the topcoat and in the at least one crack.

DETAILED DESCRIPTION

Figure 1:
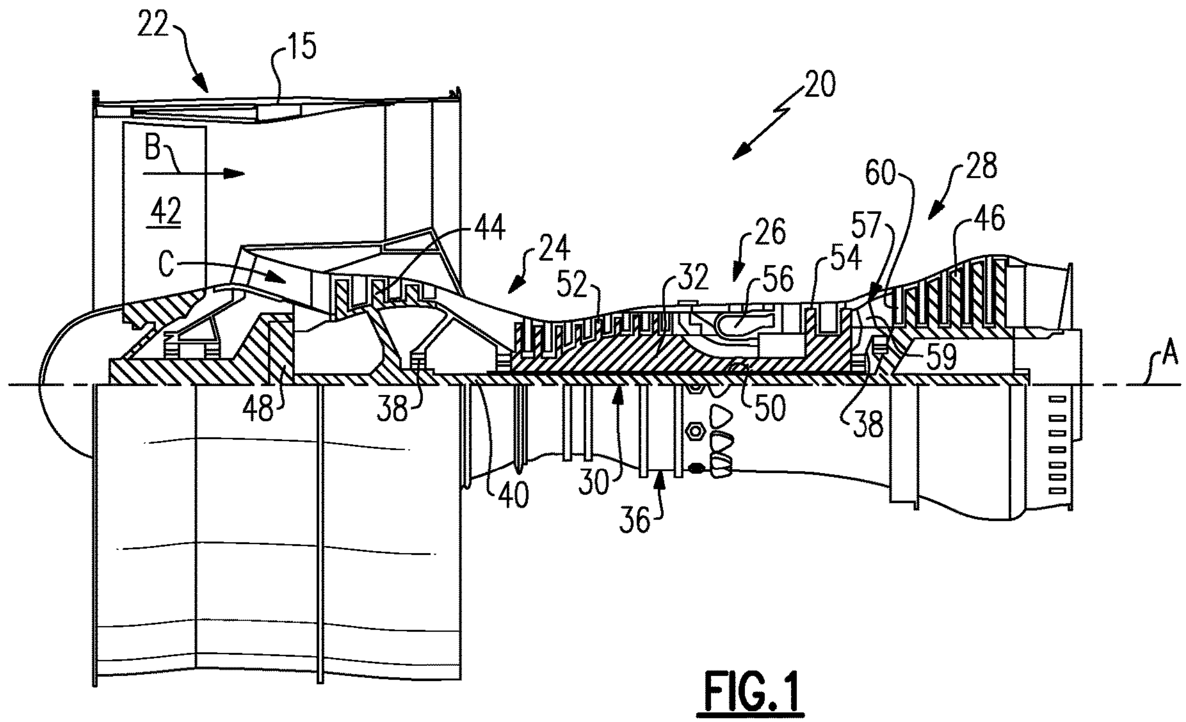
FIG. 1 is a schematic view of an example gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. The fan section 22 drives air along a bypass flow path B in a bypass duct defined within a housing 15 such as a fan case or nacelle, and also drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive a fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 57 of the engine static structure 36 may be arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded through the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of the low pressure compressor, or aft of the combustor section 26 or even aft of turbine section 28, and fan 42 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1 and less than about 5:1. It should be understood, however, that the above parameters are only exemplary of one embodiment of a geared architecture engine and that the present invention is applicable to other gas turbine engines including direct drive turbofans. A significant amount of thrust is provided by the bypass flow B due to the high bypass ratio. The fan section 22 of the engine 20 is designed for a particular flight condition—typically cruise at about 0.8 Mach and about 35,000 feet (10,668 meters). The flight condition of 0.8 Mach and 35,000 ft (10,668 meters), with the engine at its best fuel consumption—also known as "bucket cruise Thrust Specific Fuel Consumption ('TSFC')"—is the industry standard parameter of 1 bm of fuel being burned divided by 1 bf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of [(Tram ° R)/(518.7° R)]0.5. The "Low corrected fan tip speed" as disclosed herein according to one non-limiting embodiment is less than about 1150 ft/second (350.5 meters/second).

The example gas turbine engine includes the fan section 22 that comprises in one non-limiting embodiment less than about 26 fan blades 42. In another non-limiting embodiment, the fan section 22 includes less than about 20 fan blades 42. Moreover, in one disclosed embodiment the low pressure turbine 46 includes no more than about 6 turbine rotors. In another non-limiting example embodiment the low pressure turbine 46 includes about 3 turbine rotors. A ratio between the number of fan blades 42 and the number of low pressure turbine rotors is between about 3.3 and about 8.6. The example low pressure turbine 46 provides the driving power to rotate the fan section 22 and therefore the relationship between the number of turbine rotors in the low pressure turbine 46 and the number of blades 42 in the fan section 22 disclose an example gas turbine engine 20 with increased power transfer efficiency.

Figure 2:
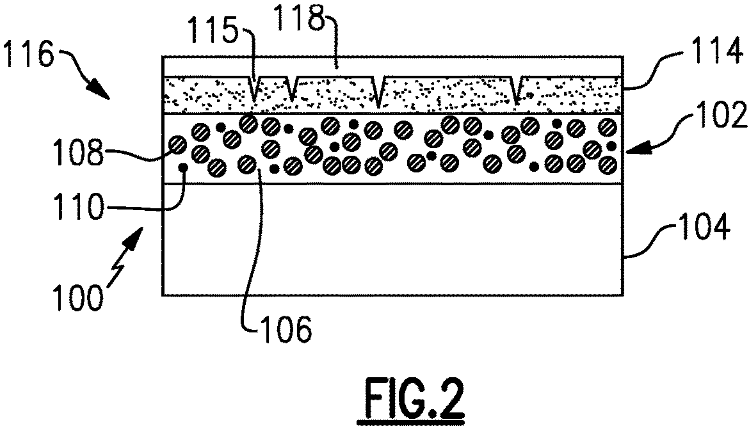
FIG. 2 illustrates an example article having a barrier layer.

FIG. 2 schematically illustrates a representative portion of an example article 100 for the gas turbine engine 20 that includes a barrier layer 102. The article 100 can be, for example, an airfoil in the compressor section 24 or turbine section 28, a combustor liner panel in the combustor section 26, a blade outer air seal, or other component that would benefit from the examples herein. In this example, the barrier layer 102 is used as an environmental barrier layer to protect an underlying substrate 104 from environmental conditions, as well as thermal conditions. As will be appreciated, the composite material 102 can be used as a stand-alone barrier layer, as an outermost/top coat with additional underlying layers, or in combination with other coating under- or over-layers, such as, but not limited to, ceramic-based topcoats.

In one example, the barrier layer 102 comprises a composite material. The composite material includes a matrix 106, such as a silica ($SiO_2$) matrix, a dispersion of "gettering" particles, and a dispersion of diffusive particles. In one example, the gettering particles are silicon oxycarbide particles (SiOC) 108 and the diffusive particles are barium-magnesium alumino-silicate particles 110 ("BMAS particles 110"), though other examples are contemplated. For instance, the gettering particles 108 may be silicon carbide, silicon nitride, silicon oxycarbide, silicon oxynitride, or silicon carbonitride. The diffusive particles 110 can be a silicate glass with additives such as Al, Mg, Ba, Ca, B, and/or Na.

In one example, the composite material includes, by volume, 1-30% of the diffusive/BMAS particles 110. In a more particular example, the composite material 102 includes, by volume, 1-10% of the diffusive/BMAS particles 110. In a further example, the composite material 102 includes, by volume, 30-94% of the gettering/silicon oxycarbide particles 108. In a particular example, the composite material includes, by volume, 60-90% of the gettering/silicon oxycarbide particles 108. In one further example, the composite material includes, by volume, 5-40% of the matrix 26 of silicon dioxide. In a further example, the composite material 102 includes, by volume, 1-30% of the diffusive/BMAS particles 110, 5-40% of the matrix 106 of silicon dioxide, and a balance of the gettering/silicon oxycarbide particles 108.

In anther example, a monolithic layer such as a layer of silicon metal can take the place of the barrier layer 102.

The barrier layer 102 protects the underlying substrate 104 from oxygen and moisture. For example, the substrate 104 can be a ceramic-based substrate, such as a siliconcontaining ceramic material. One example is silicon carbide. The silicon oxycarbide particles 108 and the BMAS particles 110 of the barrier layer function as an oxygen and moisture diffusion barrier to limit the exposure of the underlying substrate 104 to oxygen and/or moisture from the surrounding environment. Without being bound by any particular theory, the BMAS particles 110 enhance oxidation and moisture protection by diffusing to the outer surface of the barrier layer opposite of the substrate 104 and forming a sealing layer that seals the underlying substrate 104 from oxygen/moisture exposure. Additionally, the cationic metal species of the BMAS particles 110 (barium, magnesium, and aluminum, or other cationic species as would be present in other types of diffusive particles) can diffuse into the silicon oxycarbide particles 108 to enhance oxidation stability of the silicon oxycarbide material. Further, the diffusion behavior of the BMAS particles 110 may operate to seal any microcracks that could form in the barrier layer. Sealing the micro-cracks could prevent oxygen from infiltrating the barrier layer, which further enhances the oxidation resistance of the barrier layer. The gettering particles, such as the silicon oxycarbide particles 108, can react with oxidant particles, such as oxygen or water, that could diffuse into the barrier layer 102. In this way, the silicon oxycarbide particles 108 could reduce the likelihood of those oxidant particles reaching and oxidizing the substrate 104.

A topcoat 114 is disposed on the barrier layer 102. Together, the topcoat 114 and barrier layer 102 form a coating 116 on the substrate 104. The topcoat 114 may be a ceramic-based topcoat and can include one or more layers of an oxide-based material. The oxide-based material can be, for instance, hafnium-based oxides (such as hafnia, hafnium silicate or lanthanum hafnate), yttrium-based oxides (such, yttrium disilicate, or yttrium monosilicate), ytterbium-based oxides (such, ytterbium disilicate, or ytteribum monosilicate), zirconium-based oxides (such as yttria stabilized zirconia or gadolinia stabilized zirconia, gadolinium zirconate or lanthanum zirconate), or combinations thereof, but is not limited to such oxides. The topcoat 114 resists recession in combustion gases present during operation of the engine 20 while limiting the flux of oxidants to the composite material 102 and substrate 104. However, through-thickness cracks can interfere with the efficacy of the topcoat 114. Through-thickness cracks extend in a direction approximately parallel to a thickness dimension of the topcoat 114, and can extend through all or part of the thickness.

The topcoat 114 has a thickness of between about 1 to about 10 microns. In a further example, the topcoat 114 has a thickness of between about 2 to about 6 microns.

Some processing methods for application of the topcoat 114 produce topcoats 114 that are more prone to through-thickness cracking. For instance, the topcoat 114 can be applied by air plasma spray, which can in some instances cause the topcoat 114 to undergo phase segregation upon deposition, then shrink during subsequent phase changes, causing cracking. In other example, the air plasma spray may be followed by a heat treatment step which can lead to crystallization and sintering of the topcoat 114. Through-thickness cracks can form during the crystallization and sintering. Some example through-thickness cracks 115 are shown in FIG. 2. The aspect ratio of the cracks 115 is at least about 100:1. Through-thickness crack can form following thermal cycling due to differences in the thermal expansion coefficient of the top coat 114 and the substrate 104. However, air plasma spray application may have certain other benefits such as ease of manufacture and cost.

Accordingly, a filler layer 118 is deposited over the topcoat 114 as part of the coating 116. The filler layer 118 infiltrates into and fills the cracks 115 in the topcoat 114 and forms a layer over the topcoat 114. Thus the filler layer 118 minimizes the effects of cracks 115 on the performance of the topcoat 114, allowing for deposition of the topcoat 114 by conventional methods without a debit to its performance. In addition, the filler layer 118 provides an additional physical barrier for the substrate 104 and thus contributes to the environmental protection provided by the coating 116 by inhibiting the diffusion of oxidants such as steam towards the substrate 104. In one example, the filler layer 118 is between about 1 and about 2 microns thick in those regions where it is deposited over the topcoat 114.

In some examples the filler layer 118 can include additional protective properties. For instance, it may provide protection from environmental contaminants such as (calcium-magnesium-aluminosilicate) CMAS by including constituents that react with the contaminants to form reaction products that are not as deleterious.

In one example the filler layer 118 has self-healing properties similar to the diffusive particles 110 discussed above. For instance, the filler layer 118 may contain oxide species which could react with fluxing glass species from the composite material 102 to flow into any cracks that form in the filler layer 118 at the operating temperatures of the engine 20.

In one example the filler layer 118 is selected to expand on oxidation to fill cracks 115. One particular example is hafnium nitride.

In some examples the filler layer 118 resists cracking within itself. For instance, the filler layer 118 is selected to not constrict in volume at the operating temperatures of the engine 20. In one example, the filler layer 118 is selected to have a modulus of elasticity low enough to provide some flexibility to the material and prevent cracking due to mechanical manipulation of the article 100. For instance, the filler layer 118 has a modulus less than about 200 GPa. In one example, the filler layer 118 has a density that is higher than the density of the topcoat 114, which also contributes to its crack-resistance.

In addition, in one example the filler layer 118 has a coefficient of thermal expansion that is lower than a coefficient of thermal expansion of the topcoat 114. Accordingly, upon high temperature exposure, the filler layer 118 experiences compressive stresses upon cooling, which compressive stresses can inhibit the initiation of cracks in the filler layer 118 that could grow into the top coat 114. In a particular example, the coefficient of thermal expansion of the filler layer is less than about $6\times10^{-6}$ $K^{-1}$.

The filler layer 118 can be any material that provides the desired crack resistance as discussed above. For instance, the filler layer 118 may be $HfO_2$, $HfSiO_4$, $ZrSiO_4$, $Yb_2Si_2O_7$, $La_2Hf_2O_7$ a silicate glass, $Al_2O_3$, or combinations thereof. The filler layer 118 may be the same or different material as the topcoat 114.

The filler layer 118 is applied over the topcoat 114 by any suitable method. In one example, the filler layer 118 is applied by atomic layer deposition (ALD), which allows for deep penetration into the high aspect ratio cracks and which can be used to deposit a high-density crack resistant coating as discussed above. ALD is known in the art and will not be described in detail here. The ALD can be a single-layer ALD of material such as $HfO_2$, $Al_2O_3$, $SiO_2$. In another example, ALD is deposited as a nanolaminate to form complex silicates such as by depositing alternating layers of $HfO_2$ and $SiO_2$ which react to create hafnium silicate. ALD is used to deposit metallic Hf and/or Si which can be oxidized upon heating in air to form the desired oxides.

In another example, the filler layer 118 is applied by a slurry coating method, which is also known and will not be described herein. In this example, a driving force such as vacuum may be applied to force the slurry into the cracks 115, as is known in the art.

In another example, the filler layer 118 is applied by a chemical vapor deposition (CVD) method, which is also known in the art and will not be described herein.

In some examples, prior to the deposition of the filler layer 118, the topcoat 114 is heat-treated to induce crack 115 formation as discussed above, even before the article 100 is exposed to the operating conditions of the engine 20. Therefore the cracks are preemptively formed and filled prior to the article 100 being used.

As used herein, the term "about" and "approximately" have the typical meanings in the art, however in a particular example "about" and "approximately" can mean deviations of up to 10% of the values described herein.

Although the different examples are illustrated as having specific components, the examples of this disclosure are not limited to those particular combinations. It is possible to use some of the components or features from any of the embodiments in combination with features or components from any of the other embodiments.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. An article, comprising:

a substrate;

a barrier layer disposed on the substrate;

an oxide-based ceramic material topcoat disposed on the barrier layer, the topcoat including at least one crack; and a filler layer disposed on the topcoat and in the at least one crack, wherein an overall density of the filler layer is higher than an overall density of the topcoat, wherein the at least one crack has a width less than about 100 nm.

2. The article of claim 1, wherein the barrier layer is a composite material, the composite material including a matrix, diffusive particles dispersed in the matrix, and gettering particles dispersed in the matrix.

3. The article of claim 1, wherein the barrier layer is a monolithic layer.

4. The article of claim 1, wherein the filler layer has a coefficient of thermal expansion less than about $6\times10^{-6}$ $K^{-1}$.

5. The article of claim 1, wherein the filler layer has a thickness of between about 1 and about 2 microns.

6. The article of claim 1, wherein the crack has an aspect ratio of at least about 100:1.

7. The article of claim 1, wherein the at least one crack is a through-thickness crack that extends in a direction approximately parallel to a thickness dimension of the topcoat.

8. The article of claim 7, wherein the through-thickness crack extends through the entire thickness dimension.

9. The article of claim 1, wherein the topcoat includes a ytterbium-based oxide.

10. The article of claim 1, wherein the filler layer includes $HfO_2$.

11. The article of claim 1, wherein the filler layer includes $Al_2O_3$.

12. The article of claim 1, wherein the filler layer has a modulus of elasticity less than about 200 GPa.

13. An article, comprising:

a substrate;

an oxide-based ceramic material topcoat disposed on the substrate, the topcoat including at least one crack; and a filler layer disposed on the topcoat and in the at least one crack, wherein an overall density of the filler layer is higher than an overall density of the topcoat, and wherein the at least one crack has a width less than about 100 nm.

14. The article of claim 13, wherein the at least one crack is a through-thickness crack that extends in a direction approximately parallel to a thickness dimension of the topcoat.

15. The article of claim 14, wherein the through-thickness crack extends through the entire thickness dimension.

16. A method of applying a coating to an article, comprising:

disposing a barrier layer on a substrate;

disposing an oxide-based ceramic material topcoat on the barrier layer, the topcoat including at least one crack; and disposing a filler layer on the topcoat and in the at least one crack, wherein the at least one crack has a width less than about 100 nm, and wherein an overall density of the filler layer is higher than an overall density of the topcoat.

17. The method of claim 16, wherein the barrier layer is a monolithic layer.

18. The method of claim 16, wherein the filler layer is disposed on the topcoat by atomic layer deposition.

19. The method of claim 16, wherein the filler layer is disposed on the topcoat by slurry coating.

20. The method of claim 16, wherein the filler layer is disposed on the topcoat by chemical vapor deposition.

* * * * *